(12) United States Patent
Wessels et al.

(10) Patent No.: US 8,236,670 B2
(45) Date of Patent: Aug. 7, 2012

(54) METHOD OF APPLYING A PATTERN OF METAL, METAL OXIDE AND/OR SEMICONDUCTOR MATERIAL ON A SUBSTRATE

(75) Inventors: Jurina Wessels, Stuttgart (DE); Akio Yasuda, Tokyo (JP); Zoi Karipidou, Burgherrenstrasse (DE); Akos Schreiber, Stuttgart (DE); Marc Riedel, Grosshabersdorf (DE); Daniel Schwaab, Eitorf (DE); Dirk Mayer, Frechen (DE); Andreas Offenhaeusser, Eynatten (BE)

(73) Assignees: Sony Deutschland GmbH, Berlin (DE); Forschungszentrum Juelich GmbH, Juelich (DE)

( * ) Notice: Subject to any disclaimer, the term of this patent is extended or adjusted under 35 U.S.C. 154(b) by 887 days.

(21) Appl. No.: 12/294,434

(22) PCT Filed: Mar. 26, 2007

(86) PCT No.: PCT/EP2007/002665
§ 371 (c)(1),
(2), (4) Date: Nov. 6, 2008

(87) PCT Pub. No.: WO2007/112878
PCT Pub. Date: Oct. 11, 2007

(65) Prior Publication Data
US 2011/0180906 A1 Jul. 28, 2011

(30) Foreign Application Priority Data
Mar. 31, 2006 (EP) .................................. 06006899

(51) Int. Cl.
*H01L 21/20* (2006.01)

(52) U.S. Cl. ........ 438/478; 438/458; 438/584; 438/669; 438/778

(58) Field of Classification Search .................. 438/458, 438/478, 584, 669, 778
See application file for complete search history.

(56) References Cited

U.S. PATENT DOCUMENTS

| 6,946,332 B2 | 9/2005 | Loo et al. |
|---|---|---|
| 2003/0175154 A1 | 9/2003 | Hsu et al. |
| 2006/0019076 A1 | 1/2006 | Kim et al. |
| 2006/0137554 A1 | 6/2006 | Kron et al. |
| 2006/0137555 A1 | 6/2006 | Simon |
| 2006/0159305 A1 | 7/2006 | Simon |

FOREIGN PATENT DOCUMENTS

| EP | 1 657 070 | 5/2006 |
|---|---|---|
| EP | 1 688 790 | 8/2006 |
| EP | 1 748 316 | 1/2007 |
| JP | 5 58018 | 3/1993 |
| JP | 7 10610 | 1/1995 |
| JP | 9 205270 | 8/1997 |
| JP | 11 251722 | 9/1999 |

(Continued)

OTHER PUBLICATIONS

Loo, Y. et al., "High-Resolution Transfer Printing On GaAs Surfaces Using Alkane Dithiol Monolayers", J. VAC. SCI. TECHNOL., vol. 20, No. 6, pp. 2853-2856 (2002).

(Continued)

*Primary Examiner* — Long Pham
(74) *Attorney, Agent, or Firm* — Oblon, Spivak, McClelland, Maier & Neustadt, L.L.P.

(57) ABSTRACT

A method of applying a pattern of metal, metal oxide, and/or semiconductor material on a substrate, a pattern created by that method, and uses of that pattern.

46 Claims, 20 Drawing Sheets

FOREIGN PATENT DOCUMENTS

| | | |
|---|---|---|
| JP | 2000 183502 | 6/2000 |
| JP | 2004 306412 | 11/2004 |
| JP | 2005 158294 | 6/2005 |

OTHER PUBLICATIONS

Office Action issued Dec. 29, 2010 in China Application No. 200780011476.3 (With English Translation).

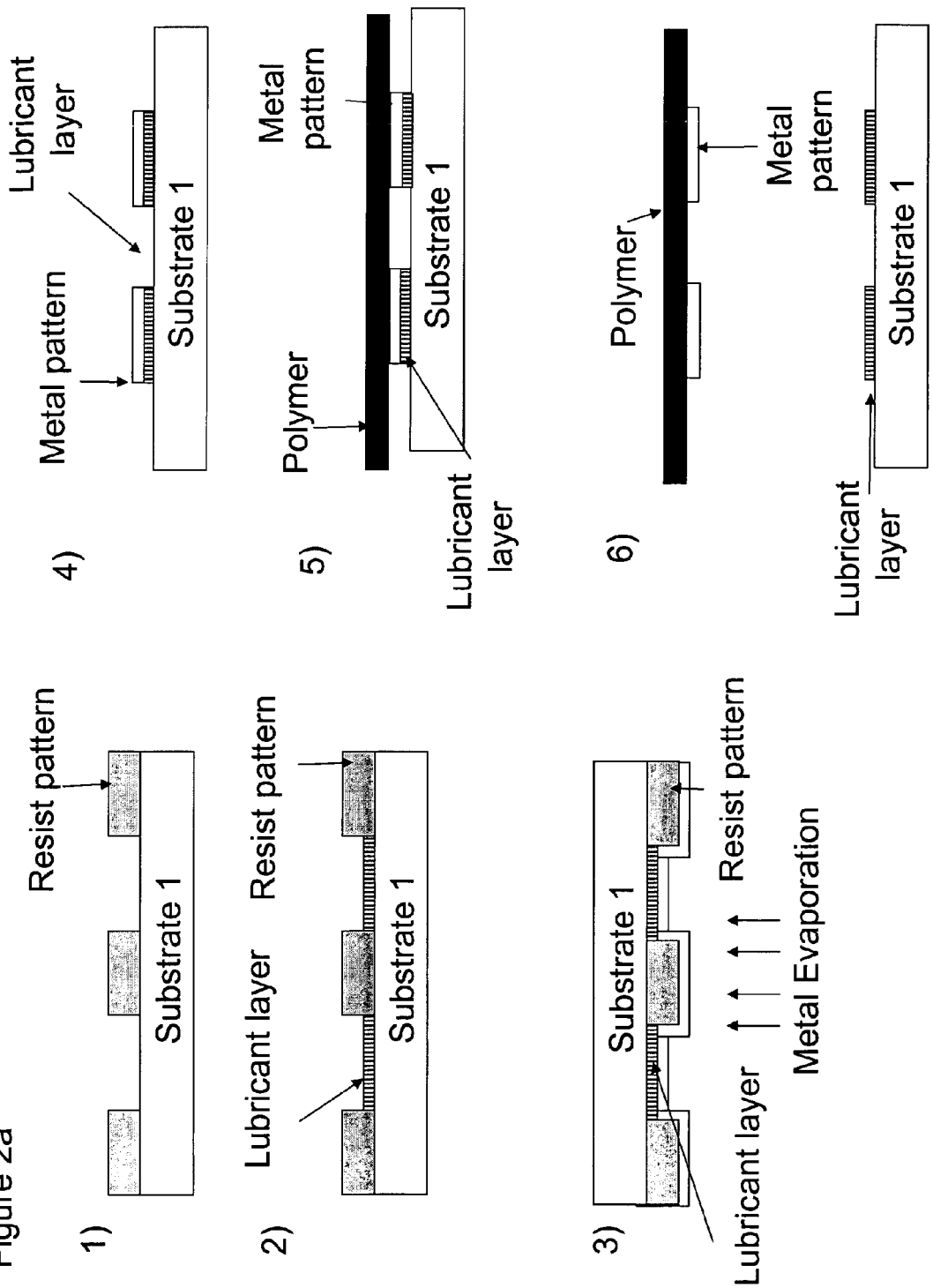

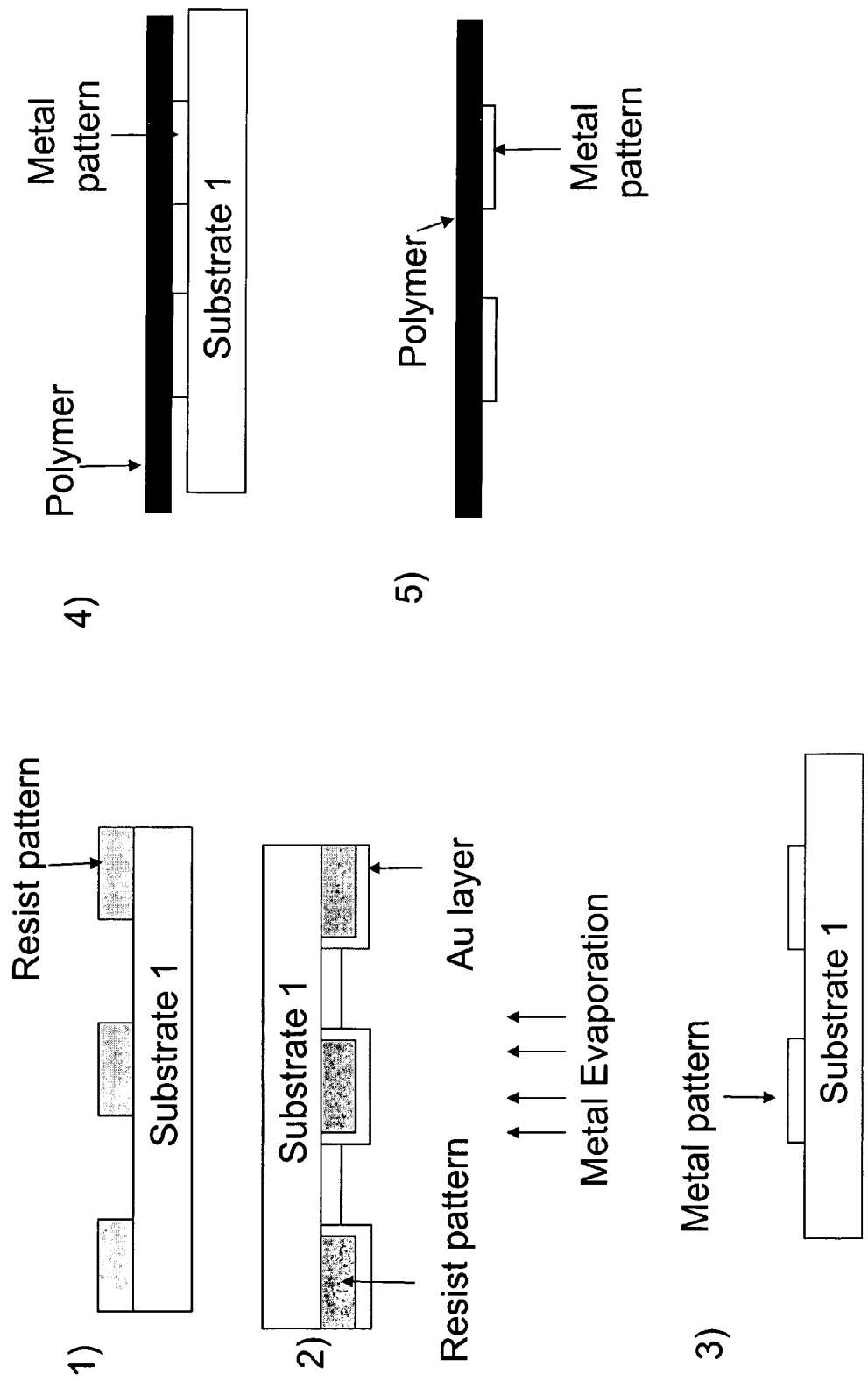

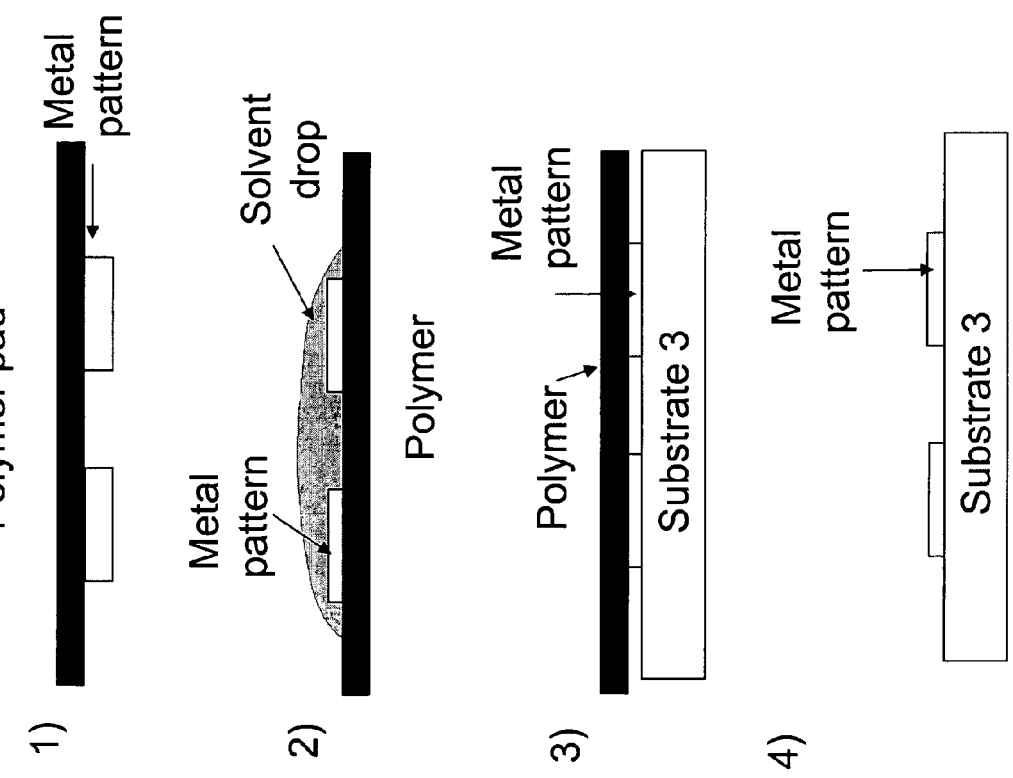

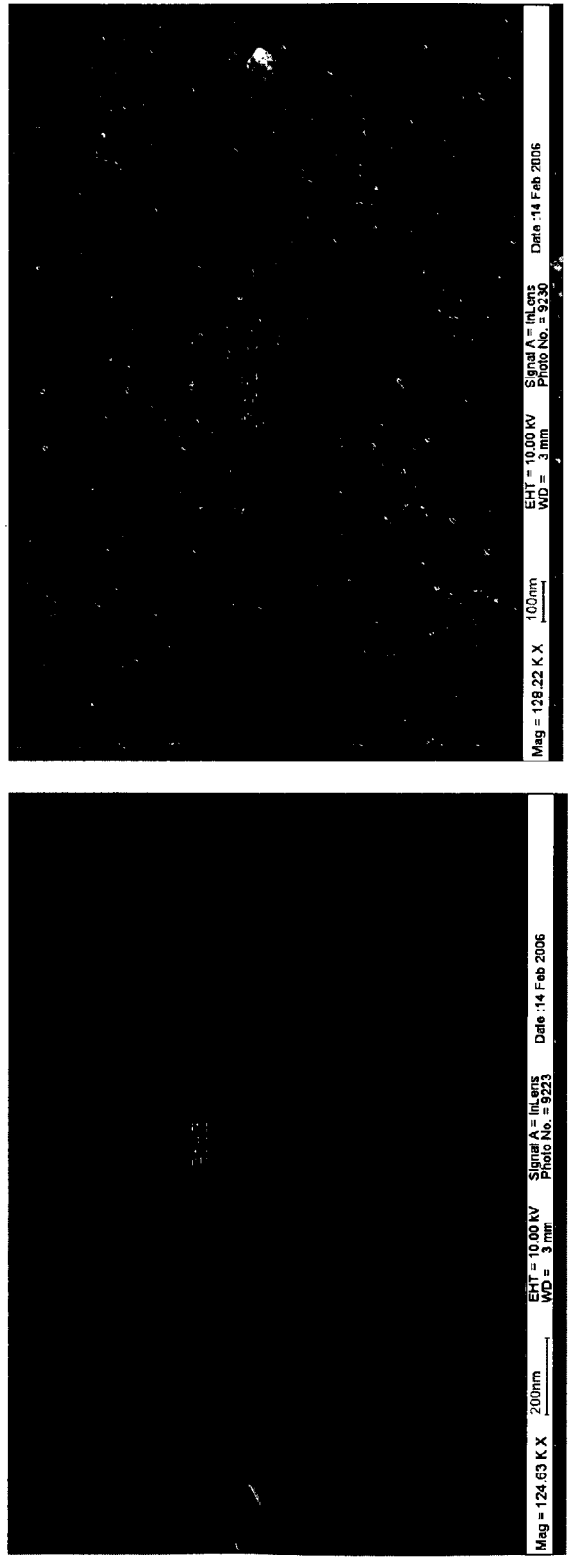
Figure 3b  Example 1

Figure 4a — Example 2

Figure 4b    Example 3a

Example 4

Example 5

150nm line of gold transferred to PAMAM-OS G6

Figure 8  Example 6

Example 7
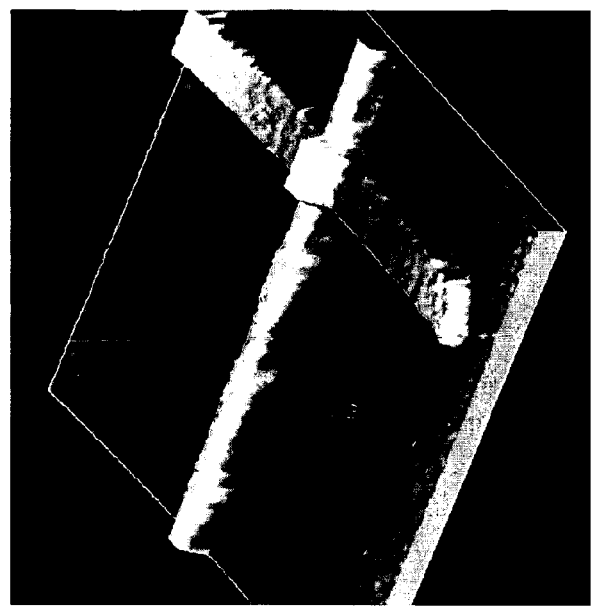
Figure 9
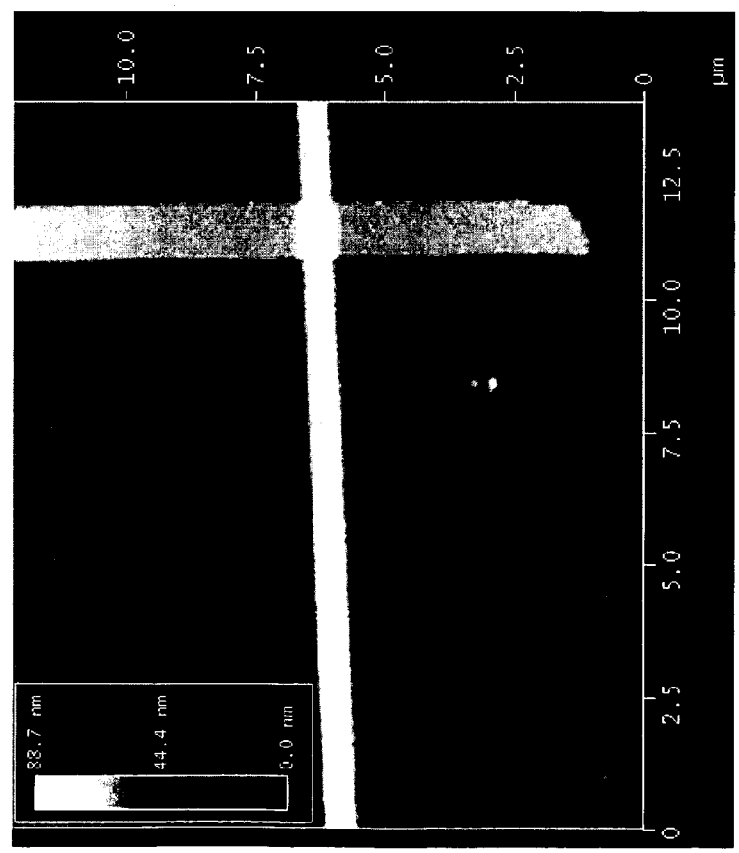

METHOD OF APPLYING A PATTERN OF METAL, METAL OXIDE AND/OR SEMICONDUCTOR MATERIAL ON A SUBSTRATE

The present application relates to a method of applying a pattern of metal, metal oxide and/or semiconductor material on a substrate, to a pattern created by such method and to uses of such pattern.

During the past decade, soft lithography has developed to a versatile technique for fabricating chemically micro- and nanostructured surfaces [1,2]. Among several techniques known collectively as soft lithography, micro contact printing (µCP) has become the most commonly used method [1]. The technique was initially developed for the transfer of molecules and was also applied for the transfer of metals [3].

Figure 1A:
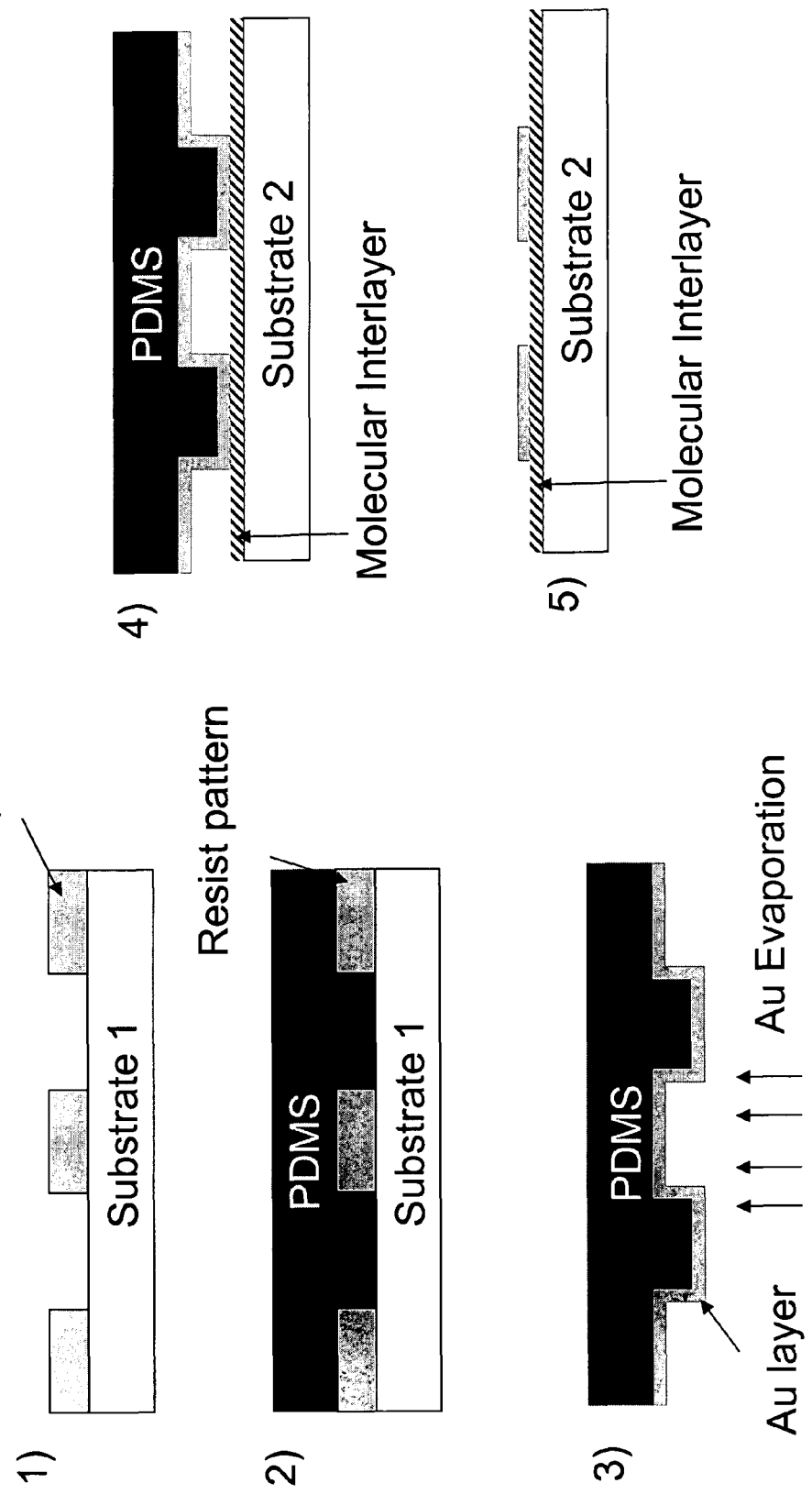

Two soft-lithographic methods for contacting organic materials with metals have been developed up to now, namely nanotransfer printing (nTP) [4,5] and soft-contact lamination (ScL) [6]. They can be used for the parallel fabrication of multiple devices. Both methods are schematically depicted in FIG. 1.

In case of nTP (FIG. 1a), a thin layer of metal is evaporated onto a patterned elastomeric stamp, which has been fabricated by drop casting of polydimethylsiloxane (PDMS) onto a patterned Si wafer. The evaporated metal layer is brought into conformal contact with an organic layer on a substrate. As a result of the chemical bond formation at the metal-organic interface, the metal-organic adhesion is stronger than the metal-PDMS adhesion and the metal layer is transferred from the PDMS stamp onto the organic layer. The process takes place under ambient conditions without application of any additional pressure. This process has been demonstrated by the fabrication of Au top electrodes in Au/alkanedithiol/GaAs hetero junctions [7] and Au/mercaptosilane/Si hetero junctions [8]. In another process gold was patterned on Silicon wafers and subsequently transferred to selected polymers at high pressure (9-30 bar) and temperature between 100 and 140° C. [9].

Figure 1B:
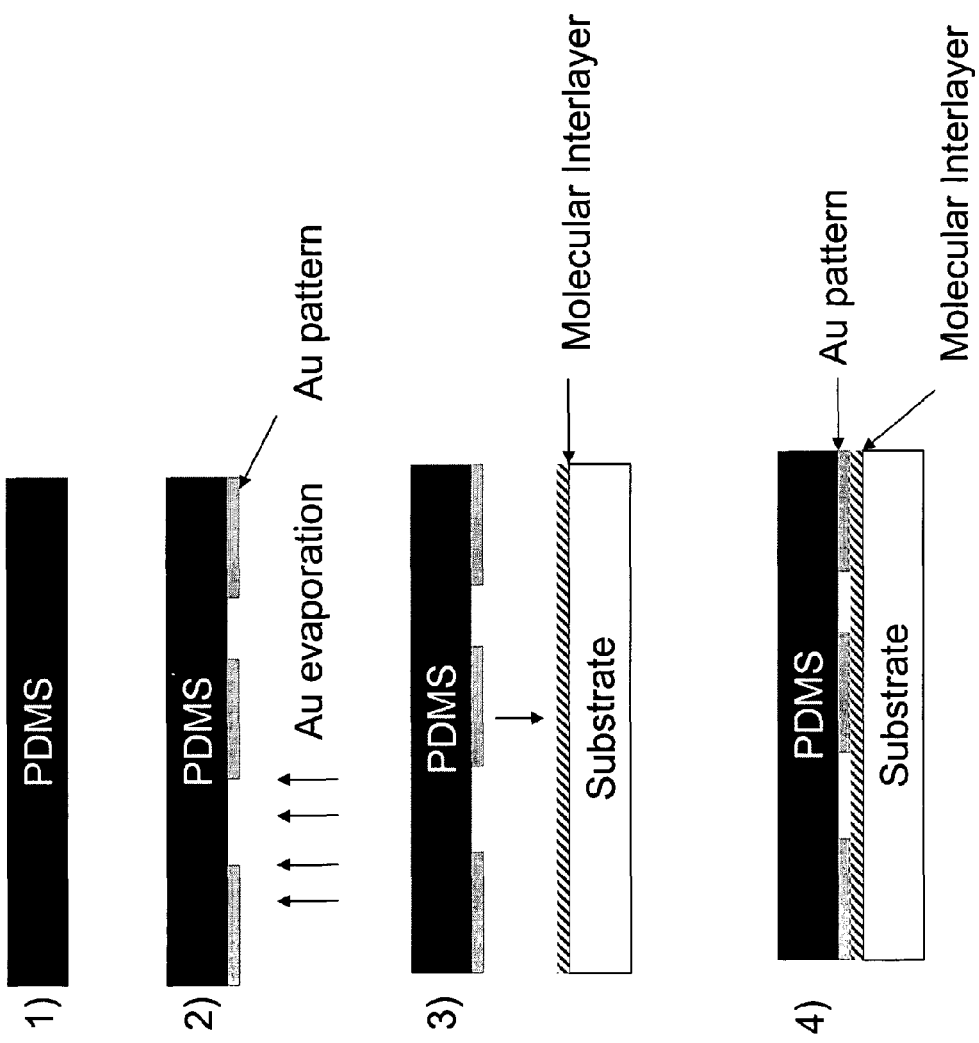

In case of ScL the metal-organic adhesion is based on van der Waals interactions and weaker than the metal-PDMS interaction. Thus in this process the metal is not transferred from the PDMS onto the organic layer, but the PDMS remains on the Au layer and is part of the PDMS/metal/organic/substrate hetero junction (FIG. 1b). The metal layer is prepared on top of an unstructured flat PDMS layer using shadow mask evaporation. The process takes place under ambient conditions without application of any additional pressure [10].

Both processes, however, are not scalable to critical dimensions below 50 nm. In case of ScL the scaling of the process is difficult since the metal structures are defined on a flat stamp by using a shadow mask evaporation technique. In case of nTP the critical dimensions for the transfer are limited by the properties of the stamps:

- The stamp material should not be too hard, so that the transfer across step edges is possible.
- The aspect ratio of the structures in the stamps has to be optimized with respect to buckling, lateral collapse and roof collapse.
- The evaporation of Au onto the structured stamp is critically dependent on the angle of evaporation and on the aspect ratio of the stamp.
- The transfer of the Au layer from the stamp onto the substrate at the contact area requires a destruction of the homogeneous Au layer on the stamp surface. The disruption of the Au layer can lead to rough edges.

In addition to the above described processes, it is also possible to directly evaporate metals in patterns or without patterns onto molecular layers immobilized onto substrates. However, it is known that it is difficult to avoid the diffusion of metal atoms into the molecular layers. These atoms can easily lead to the formation of e.g. filaments, that dominate the I-V characteristic across the molecular layers. For GaAs/Dithiol/Au junctions it was shown [11] that evaporation of Au onto monolayers of dithiol derivatives, unavoidably leads to direct contacts between GaAs and the evaporated gold. These "shorts" dominate the IV characteristics. In case of nTP none of these direct contacts were found.

None of the aforementioned techniques could be scaled down to dimensions as low as 50-100 nm. Moreover, it has not been possible to prepare patterns having a surface roughness in the nm-range, nor was it possible to create patterns that had smooth edges.

Accordingly, it was an object of the present invention to provide for a fabrication process which can be scaled down to dimensions as low as 50-100 nm which fabrication process is easy to perform and versatile with respect to different metals, metal oxides and semiconductor materials. It has furthermore been an object of the present invention to provide for a process allowing the fabrication of patterns having smooth edges and a mean surface roughness $\leq 2$ nm. The objects of the present invention are solved by a method of applying a pattern of metal, metal oxide and/or semiconductor material on a substrate, comprising the steps:

a) providing a first substrate,
b) creating a pattern of metal, metal oxide and/or semiconductor material on said first substrate,
c) providing a second substrate and bringing it into conformal contact with said pattern of metal, metal oxide and/or semiconductor material on said first substrate,
d) separating said second substrate from said first substrate, thus having said pattern of metal, metal oxide and/or semiconductor material adhere to said second substrate and being separated together with said second substrate from said first substrate.

In one embodiment step b) is performed by the following sequence of steps:
ba) creating a resist pattern on said first substrate,
bb) applying a layer of metal, metal oxide and/or semiconductor material on said first substrate having said resist pattern on it,
bc) removing said resist pattern from said first substrate to leave behind a pattern of metal, metal oxide and/or semiconductor material on said first substrate.

In another embodiment step b) is performed by the following sequence of steps:
ba) applying a layer of metal, metal oxide and/or semiconductor material on said first substrate,
bb) creating a resist pattern on said first substrate having said layer of metal on it,
bc) removing said layer of metal, metal oxide and/or semiconductor material in positions which are not covered by said resist pattern, by means of an etching technique,
bd) removing said resist pattern from said first substrate to leave behind a pattern of metal, metal oxide and/or semiconductor material on said first substrate.

In yet another embodiment step b) is performed by the following steps:
ba) applying a layer of metal, metal oxide and/or semiconductor material on said first substrate by using a patterned mask through which said metal, metal oxide and/ or semiconductor material is applied such that said layer of metal, metal oxide and semi-conductor material becomes patterned.

In the embodiments, involving a resist pattern, said resist pattern on said first substrate preferably, comprises positions having resist present on said first substrate and positions having no resist present on said first substrate.

In the embodiments, wherein the resist pattern is first created and subsequently a layer of metal oxide and/or semiconductor material is applied ("resist first" embodiment), preferably, in step bb), said layer of metal, metal oxide and/or semiconductor material is applied on said first substrate on said resist pattern both in said positions having resist present and in said positions having no resist present.

In one embodiment, said layer of metal, metal oxide and/or semiconductor material is applied as a continuous layer.

In the "resist first" embodiment, preferably, said pattern of metal, metal oxide and/or semi-conductor material created by step b), comprises positions having metal, metal oxide and/or semiconductor material present on said first substrate and positions having no metal, metal oxide and/or semiconductor material present on said first substrate, and said positions of said pattern of metal, metal oxide and/or semiconductor material having metal, metal oxide and/or semiconductor material present on said first substrate coincide with positions of said resist pattern of step ba) where there is no resist present on said first substrate in step ba).

In the embodiment, wherein first layer of metal, metal oxide and/or semiconductor material is applied and subsequently a resist pattern is created ("resist second" embodiment), it is preferred that said pattern of metal, metal oxide and/or semiconductor material created by step b), comprises positions having metal, metal oxide and/or semiconductor material present on said first substrate and positions having no metal, metal oxide and/or semiconductor material present on said first substrate, and said positions of said pattern of metal, metal oxide and/or semiconductor material having metal, metal oxide and/or semiconductor material present on said first substrate coincide with positions of said resist pattern of step bb) where there is resist present on said first substrate in step bb).

In the embodiments, involving a resist pattern, said resist pattern is, preferably, created by a lithographic process, preferably by a lithographic process selected from the group comprising optical lithography, electron beam lithography, soft lithography, UV-nanoimprint lithography and nanoimprint lithography.

Preferably, said layer of metal, metal oxide and/or semiconductor material is applied on said first substrate by a process selected form the group comprising vapour deposition, sputtering, evaporation, wet chemical deposition, plating and self-assembly.

In the embodiments, involving a resist pattern, the removing of said resist pattern preferably occurs by dissolving said resist pattern in a solvent, such acetone, isopropanol, N-pyrrolidone, and special resist removers, such as AZ-remover, and any combination thereof.

Preferably, said first substrate is made of a material selected from the group comprising single crystalline materials, polycrystalline materials, materials such as GaAs, Si, $SiO_2$, mica, amorphous composites, such as glass and float glass, and perovskites.

Preferably, said metal is select from the group comprising Au, Ti, Pt, Ag, Cr, Cu, Al, said metal oxide is selected from the group comprising $Al_2O_3$, AgO, $TiO_2$, $SiO_2$, $DyScO_3$, yttria stabilized zirconia (YSZ), and said semiconductor material is selected from the group comprising Si, Ge, GaAs, GaN, InSb, InP, CdS, ZnSe.

In one embodiment, said layer of metal, metal oxide and/or semiconductor material is applied directly on said first substrate or, if present, on said resist pattern on said first substrate, without a layer of lubricant being present on or having been previously applied to said first substrate or, if present, on said resist pattern on said first substrate, said layer of metal, metal oxide and/or semiconductor material after application thus being in direct contact with said first substrate and/or said resist pattern.

Preferably, in the "resist first" embodiment, step ba) is performed in the following manner:
  ba) creating a resist pattern on said first substrate and thereafter applying a layer of lubricant to said resist pattern on said first substrate to weaken the adhesion between said pattern of metal, metal oxide and/or semiconductor material and said first substrate having a resist pattern on it.

Preferably, in the "resist second" embodiment, step ba) is performed in the following manner:
  ba) applying a layer of lubricant to said first substrate and thereafter applying a layer of metal, metal oxide and/or semiconductor material to said first substrate having a layer of lubricant on it, said layer of lubricant serving the purpose of weakening the adhesion between said pattern of metal, metal oxide and/or semiconductor material and said first substrate.

Preferably, in the embodiment involving no resist, step ba) is performed in the following manner:
  ba) applying a layer of lubricant to said first substrate and thereafter applying a layer of metal, metal oxide and/or semiconductor material to said first substrate having a layer of lubricant on it, said layer of lubricant serving the purpose of weakening the adhesion between said pattern of metal, metal oxide and/or semiconductor material and said first substrate.

Preferably, said lubricant is selected from the group comprising fluorosilanes, such as perfluoro-alkyltrichlorosilane $C_4F_8$, silane derivatives with a $CH_3$ terminus, teflon and teflon-like materials.

Preferably, in the "resist first" embodiment, in step ba) said layer of lubricant is applied to said resist pattern on said first substrate, wherein, after subsequently removing said resist pattern in step bc), said layer of lubricant is only present in said positions having no resist present.

More preferably in step bb), said layer of metal, metal oxide and/or semiconductor material is applied on said first substrate having a resist pattern on it, such that it is in direct contact with said resist pattern in positions having resist present and in direct contact with said lubricant in positions having no resist present.

In one embodiment, after said pattern of metal, metal oxide and/or semiconductor material has been created in step b) on said first substrate, a transfer-mediating layer is applied to said pattern of metal, metal oxide and/or semiconductor material prior to step c), which transfer-mediating layer serves the purpose of mediating adhesion between said pattern of metal, metal oxide and/or semiconductor material and said second substrate, wherein, preferably, said transfer-mediating layer is made of a material comprising a compound having at least two termini, wherein one terminus is a metal binding, metal oxide binding or semiconductor binding group, such as thiol, and the other terminus provides controllable adhesion to said second substrate.

Such controllability may, for example, be achieved by appropriate choice of solvent which interacts with said terminus.

More preferably, said transfer-mediating layer is providing controllable adhesion by comprising at least one compound having polar groups for interaction with a hydrophilic solvent, said compound preferably forming a self-assembled monolayer, such as an alkanethiol, or said transfer mediating layer is soluble in water, such as a layer of CaO.

In one embodiment said second substrate is made of a polymeric material, preferably a polymeric material selected from the group comprising elastomers, plastomers, ionomers and resists.

In one embodiment during or after step c) and before step d), said second substrate and said pattern of metal, metal oxide and/or semiconductor material on said first substrate, whilst being in conformal contact with each other, are exposed or placed into a polar solvent to weaken the adhesion between said pattern of metal, metal oxide and/or semiconductor material and said first substrate, wherein, preferably said polar solvent is selected from the group of organic and inorganic polar solvents and mixtures thereof, preferably from the group comprising water, isopropanol, ethanol, methanol, acetone, dimethylsulfoxide and acetonitrile, and mixtures thereof.

Preferably, said solvent does not have any added solutes dissolved in said solvent.

"Added solutes", as used herein, is meant to signify that said solvent does not contain any solutes which have been specifically added to it, e.g. by the experimenter or the manufacturer. "Added solutes", however, does not exclude the presence of dissolved impurities or dissolved gasses or humidity.

In another embodiment after step b) and before step c), said pattern of metal, metal oxide and/or semiconductor material on said first substrate is placed in a solution of a surfactant and, optionally, subsequently rinsed, wherein, preferably said surfactant is selected from the group comprising dithiocarbamate derivatives formed from alkane chains with primary amines, and the solvent wherein said surfactant is dissolved is selected from the group comprising isopropanol, ethanol, water and mixtures thereof.

In one embodiment said method comprises the additional step:
  e1) providing a third substrate, bringing it into conformal contact with said second substrate having said pattern of metal, metal oxide and/or semiconductor material on it, and separating said second substrate from said third substrate, thus having said pattern of metal, metal oxide and/or semiconductor material adhere to said third substrate and being separated together with said third substrate from said second substrate.

Preferably, said third substrate has functional groups allowing a transfer of said pattern of metal, metal oxide and/or semiconductor material from said second substrate to said third substrate, such as mercapto groups or amino groups on it.

In one embodiment said third substrate, prior to step e1) has a further pattern of metal, metal oxide and/or semiconductor material on its surface, and/or an additional layer on it providing functionality, and/or is covered with nanowires, nanocolumns, carbon nanotubes, and/or has switchable oxides, such as $TiO_2$ or perovskites on it.

In one embodiment said method comprises the additional step:
  e2) using said second substrate having said pattern of metal, metal oxide and/or semi-conductor materials adhered to it for the preparation of a flexible organic electronic device, such as an organic light emitting diode (OLED), an organic field effect transistor (OFET), a molecular electronic device or a sensor device, preferably by laminating said second substrate to another substrate and thereby sandwiching said pattern of metal, metal oxide and/or semiconductor material between the two substrates.

In one embodiment said pattern of metal, metal oxide and/or semiconductor material has an adhesion force to said first, second and, if present, third substrate, wherein the adhesion force to said third substrate is greater than the adhesion force to said second substrate which is greater than the adhesion force to said first substrate.

Preferably, said pattern of metal, metal oxide and/or semiconductor material is a pattern of gold, said first substrate is Si, with or without an oxide layer on it, or mica, or glass, said second substrate is a polyolefine plastomer (POP) or polydimethylsiloxane (PDMS), or a ionomer such as Surlyn, and said third substrate, if present, is Si, mica, or glass, which is optionally functionalized with functional groups, to allow adhesion of said pattern of gold on it.

More preferably, said functionalizing occurs by using compounds having mercapto groups or amino groups or carboxy groups, preferably dendrimer compounds.

In one embodiment step e1) is performed in the absence of any additional layer providing functionality on said third substrate, wherein, preferably, step e1) is performed by weakening the adhesion forces between said second substrate and said pattern of metal, metal oxide and/or semiconductor material by exposing said second substrate and said pattern of metal, metal oxide and/or semiconductor material on it to a solvent or placing it into a solvent such as isopropanol, ethanol, methanol, propanol and hexane.

In another embodiment step e1) is performed by weakening the adhesion forces between said second substrate and said pattern of metal, metal oxide and/or semiconductor material by placing a solvent between said second substrate having said pattern of metal, metal oxide and/or semiconductor material on it and said third substrate, and thereby increasing the adhesion forces between said third substrate and said pattern of metal, metal oxide and/or semi-conductor material or, if present, between said transfer mediating layer on said third substrate and said pattern of metal, metal oxide and/or semiconductor material.

In one embodiment said second substrate is prepared by a method selected from the group comprising drop casting, curing, preferably thermo- or photo induced curing, and hot embossing.

Preferably, said second substrate has a flat surface which, in step c), said pattern of metal, metal oxide, and/or semiconductor material is brought into conformal contact with More preferably, said second substrate has a stabilizing hard back plane opposite said flat surface.

In one embodiment said bringing into conformal contact in steps c) and e1) occurs for a period in the range of from 1 s-120 min.

In one embodiment said bringing into conformal contact in steps c) and e1) is a pressing process with an average pressure of 1 mbar-5 bar.

The objects of the present invention are also solved by a pattern of metal, metal oxide and/or semiconductor material on a substrate produced by the method according to the present invention.

Preferably, said pattern has no defects or artifacts in said pattern.

The objects of the present invention are also solved by a use of the pattern according to the present invention in an electronic device, polymeric device, biomedical device.

As used herein, the term "to bring a substrate into conformal contact with a pattern of metal, metal oxide and/or semiconductor material", is meant to denote any contact between said substrate and said pattern allowing the transfer of said pattern to said substrate. In some embodiments, exertion of pressure is needed for such transfer to occur, and in these instances, the term "to bring into conformal contact with" is to be equated with "to press on (to)".

Resists useful for the purposes of the present invention are well known to someone skilled in the art. Exemplary resists useful for the purposes of the present invention are photoresists, electron-beam resists, x-ray-resists, nanoimprint resists etc. More specific examples of resists useful for the present invention are PMMA (electron-beam), AZ 5214 (photo), NXR2010-3020 (nanoimprint) or others.

Sometimes, in the present application reference is made to bringing one substrate into conformal contact with a pattern of metal on another substrate and subsequently "separating" the one substrate from the other substrate. This process of separating is not meant to imply any specific direction into which such separating occurs, nor does it imply that only one substrate is moved whereas the other substrate is kept in a fixed position. Rather, the process of "separating" may imply that one substrate is moved relative to the other, or it may imply that both substrates are moved relative to one another, or it may imply that the other substrate is moved relative to the one substrate. In one embodiment of such "separating" process, one substrate may simply be lifted from the other substrate or vice versa.

Sometimes, in this application, reference is made to positions of a pattern of metal, metal oxide and/or semiconductor material having metal, metal oxide and/or semiconductor material present on said first substrate which "coincide" with positions of a resist pattern where there is no resist present. Equally, sometimes reference is made to positions of a pattern of metal, metal oxide and/or semiconductor material having metal, metal oxide and/or semiconductor material present on a substrate which "coincide" with positions of a resist pattern where there is resist present on a substrate. This state of two sets of positions of different pattern "coinciding" with each other, in its simplest form may mean that individual positions of the two patterns may have an overlap. In another embodiment such "coinciding" means that the individual positions within the pattern of metal, metal oxide and/or semiconductor material are identical to the positions of the resist pattern where there is resist present, in which case the pattern of metal, metal oxide and/or semiconductor material is a positive image of the resist pattern. Or, in another embodiment it may mean that the individual positions of said pattern of metal, metal oxide and/or semiconductor material are identical to the positions of the resist pattern where there is no resist present, in which case this means that the pattern of metal, metal oxide and/or semiconductor material is a negative image of the resist pattern.

In this application, sometimes reference is made to a "first substrate", a "second substrate" and "a third substrate". The method according to the present invention, in its simplest form, aims at the transfer of a pattern of metal, metal oxide and/or semiconductor material from one substrate to another. In this sense, the "second substrate" may be considered a "target substrate" onto which said pattern of metal, metal oxide and/or semiconductor material is to be transferred. Likewise, if this pattern of metal, metal oxide and/or semiconductor material is subsequently to be transferred to the "third substrate", such "third substrate" may be considered the "target substrate". If all three substrates are involved in the transfer process, i.e. if the pattern of metal, metal oxide and/or semiconductor material is transferred form the first substrate via the second substrate to the third substrate, the second substrate effectively functions as a "shuttle substrate" in that it serves the purpose of transferring the pattern of metal, metal oxide and/or semiconductor material from the first substrate to third substrate.

The method according to the present invention allows for the fabrication of patterns of metal, metal oxide and/or semiconductor material having dimensions which may be as small as $\leqq 10$ nm The method according to the present invention allows the transfer of patterns where the edge roughness is determined by the edge roughness of the pattern of metal, metal oxide and/or semiconductor material prepared on the first substrate. The method according to the present invention further allows to transfer patterns across step edges. The method according to the present invention furthermore enables the preparation of metal contacts on organic layers without the introduction of ad-atoms into the molecular layer. Thus this methods avoids the introduction of defects that lead to the formation of filaments during device operation.

The present inventors have surprisingly found that it is possible to transfer a metal/metal oxide/semiconductor material pattern which is the negative or positive image of a resist pattern and thus, in terms of its dimension is only limited by the dimensions of the resist pattern, to another substrate using an intermediate shuttle substrate which is preferably of relatively soft and polymeric nature. The method according to the can be used for non invasive contacting of organic layers. The process is scalable and enables the transfer of pattern with dimension $\leqq 20$ nm under ambient conditions. The process is easy to perform.

The inventors have found that by choosing the metal/metal oxide/semiconductor material and the first substrate in such a manner that the interaction between these is smaller than the interaction between metal/metal oxide/semiconductor material pattern and the second substrate ("shuttle substrate"), a transfer of the pattern from the first substrate to the second substrate can be achieved, and to subsequent substrates if the interaction of these subsequent substrates (third substrate etc.) to the pattern is stronger than the interaction between the pattern and the second substrate. Alternatively, the respective interactions can be adjusted by the use of lubricant layers or other intermediate layers, and/or the use of solvents and/or the use of solutions to weaken the corresponding interaction.

The critical dimensions achieved in such a pattern according to the present invention are only limited by the methodology applied for the fabrication of the metal/metal oxide/ semiconductor material structures on the surfaces. Since these patterns may be created as a negative or positive image of a resist pattern, which usually is generated using a lithographical method, patterns with dimension nm can be achieved.

Different variations of the shuttle transfer printing process in accordance with the present invention are described in the following sections, wherein process 1 describes a process for the transfer of a metal layer onto a polymer pad as second substrate using a lubricant layer, while processes 2 to 4 involve no lubricant layer (process 2), the usage of a polar solvent (process 3) and the usage of a surfactant solution (process 4).

Figure 2C:
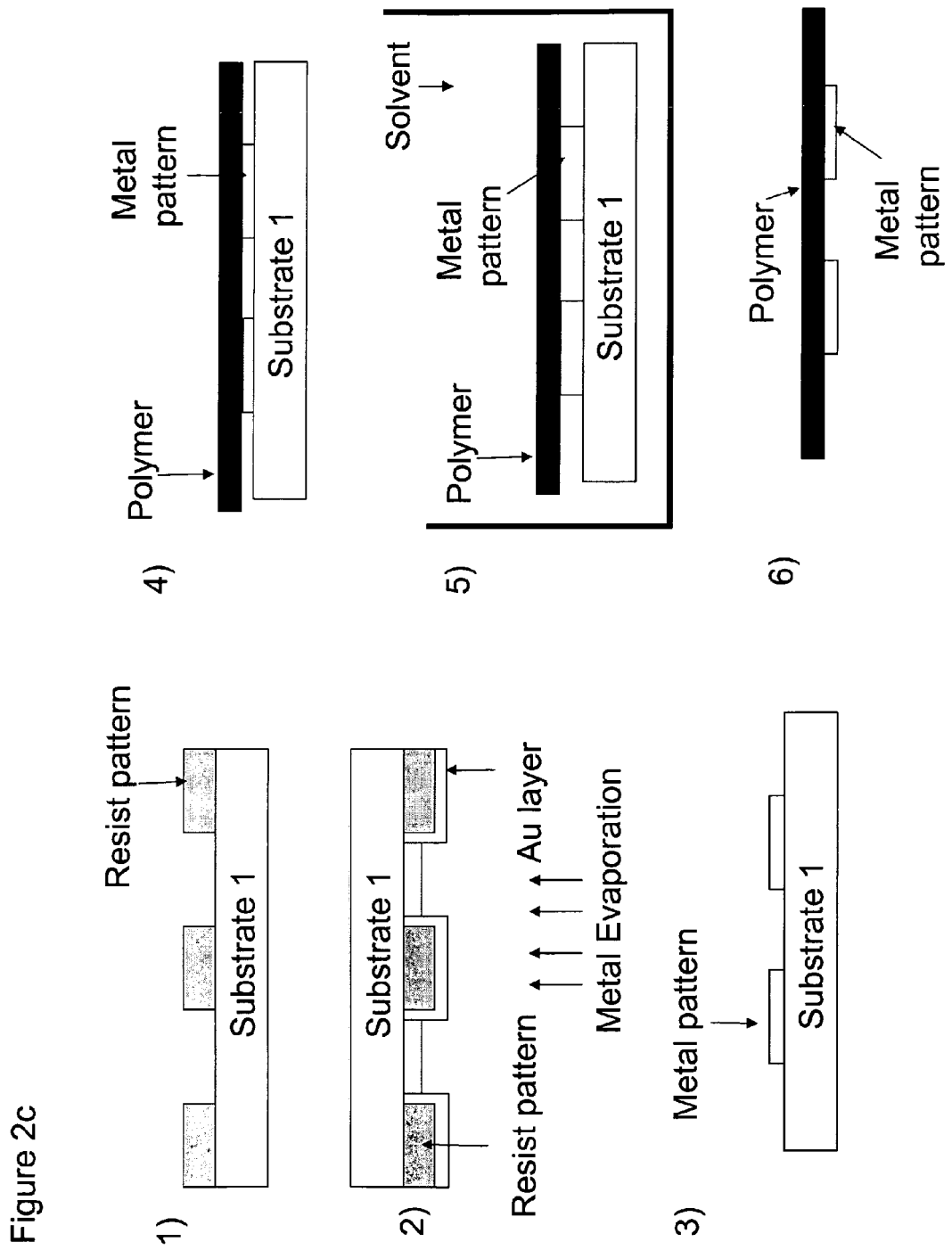

Process 1 (see FIG. 2a):

The process steps involve the preparation of a resist pattern on a flat substrate surface (1). Subsequently, a lubricant layer is deposited onto the substrate (2) before evaporation/deposition of a metal layer (3) and the lift-off step (4). Such lift-off step in this process and in the other embodiments of the present invention is performed by dissolving the resist pattern in an appropriate solvent. This process leads to a structured metal layer, which is separated from the substrate by a lubricant layer. The metal layer is brought into conformal contact with a transfer pad (5), which is typically made from a polymer. If the adhesion forces of the metal layer on the lubricant layer is weaker than the interaction between the metal layer and the polymer, the metal layer is transferred onto the polymer (6).

Process 2 (see FIG. 2b):

The process steps involve the preparation of a resist pattern on a flat substrate surface (1). Subsequently, the metal is evaporated onto the substrate (2) before the lift-off step (3). The metal layer is brought into conformal contact with a polymer pad (4). Since the adhesion forces of the metal layer on the lubricant layer is weaker than the interaction between the metal layer and the polymer, the metal layer can be transferred onto the polymer (5).

Process 3 (see FIG. 2c):

The process steps involve the preparation of a resist pattern on a flat substrate surface (1). Subsequently, the metal is evaporated onto the substrate (2) before the lift-off step (3). The metal layer is brought into conformal contact with a polymer pad (4) and immersed into a polar solvent (5). The solvent is dragged between the Au layer and the surface thereby weakening the adhesion forces between the metal layer and the substrate surface and facilitating the transfer of the metal pattern onto the polymer pad (6).

Figure 2D:
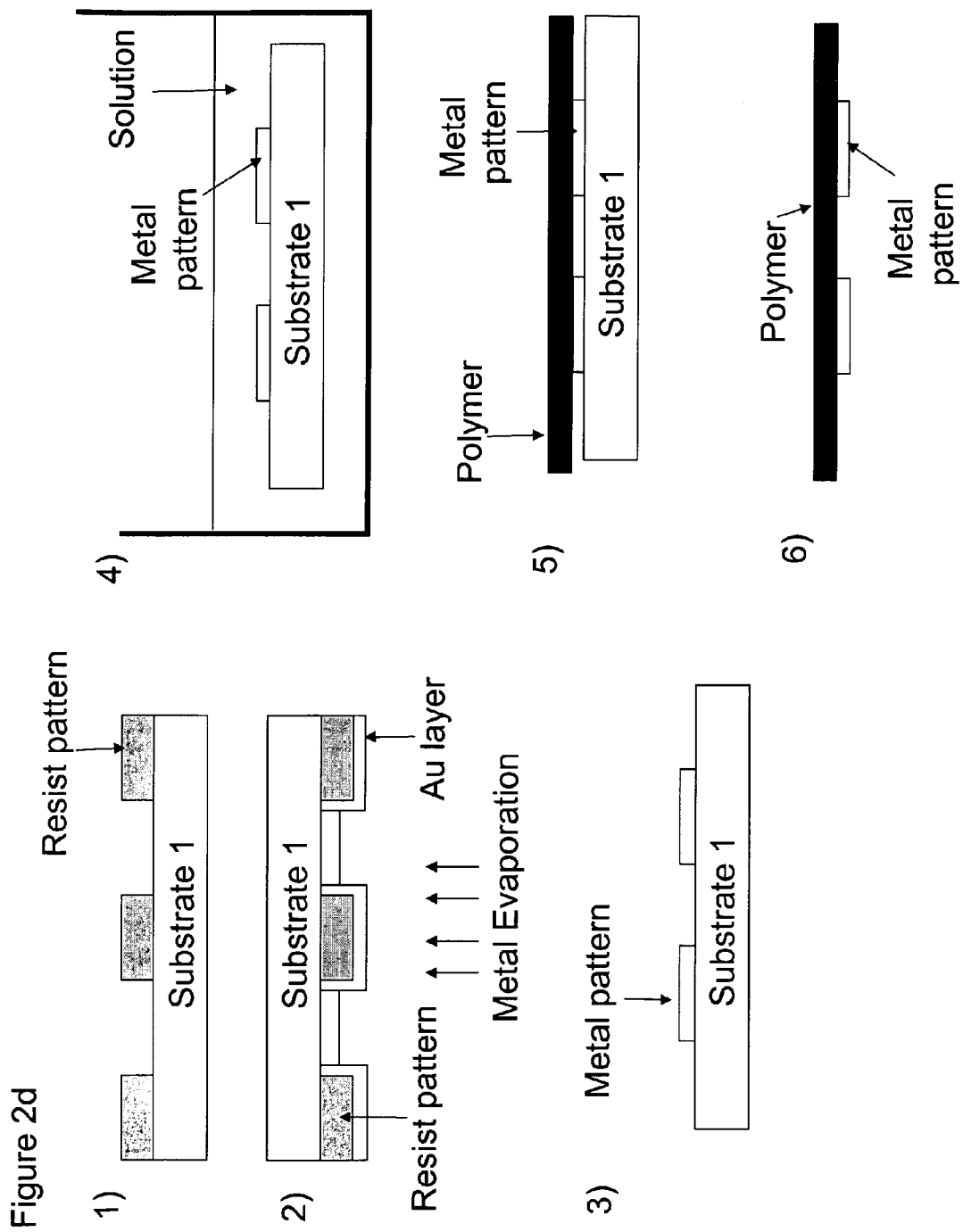

Process 4 (see FIG. 2d)

The process steps involve the preparation of a resist pattern on a flat substrate surface (1). Subsequently, the metal is evaporated onto the substrate (2) prior to the lift-off step (3). The metal layer is immersed into a solution containing dithiocarbamate derivatives derived from primary amines with long alkyl chains (4). The molecules have a character of a surfactant and also the capability to enter into the space between the metal layer and the substrate. After a given period of time the structure is rinsed in water and brought into contact with the polymer pad (5) for the transfer of the pattern (6).

From the polymer pad the metal pattern can be finally transferred onto the target substrate. Prerequisite for this last step is that the adhesion forces between the metal and the polymer pad is weaker than the adhesion forces between the metal and the target substrate.

The target substrate may have functional groups that have a strong interaction with the metal, be patterned in any way, or have an organic layer on it, which should provide any functionality, may be covered with nanowires/nanocolumns, carbon nanotubes (CNTs) etc. or may be solids of the group of switchable oxides or perovskites.

Process 5 and 6 describe the transfer of a metal pattern from the polymer pad onto a Si/SiO2 substrate.

Process 5:

The process steps involve a polymer pad with a metal pattern that was prepared according to any of the processes 1-4 (1). The metal layer on the polymer pad is wetted with a solvent (e.g. isopropanol, ethanol, hexane) (2) and brought into conformal contact with a Si/SiO2 substrate (3). The solvent is dragged between the Au layer and the surface thereby weakening the adhesion forces between the metal layer and the polymer pad and facilitating the transfer of the metal pattern onto the Si/SiO2 (4). (FIG. 2e).

Figure 2F:

Process 6:

The process steps involve the preparation of a resist pattern on a flat substrate surface (1). Subsequently, a lubricant layer is deposited onto the substrate (2) before evaporation/deposition of a metal layer (3) and a lift-off step (4). Subsequently a transfer-mediating layer is deposited onto the metal layer (5). The transfer-mediating layer/metal assembly is brought into conformal contact with a polymer pad (6). Since the adhesion forces of the metal layer on the lubricant layer is weaker than the interaction between the metal layer/transfer-mediating layer and transfer-mediating layer/polymer, the metal layer with the transfer-mediating layer can be transferred onto the polymer (7). The transfer-mediating layer on the polymer pad is brought into conformal contact with a Si/SiO2 substrate (8). Subsequently it is immersed in a solvent (e.g. isopropanol, ethanol, hexane) and the solvent is dragged between the transfer-mediating layer and the metal surface thereby weakening the adhesion forces between the metal layer and the polymer pad and facilitating the transfer of the metal pattern onto the Si/SiO2 substrate (9). At the end the metal patterns are permanently transferred to the Si/SiO2 substrate (10) (see FIG. 2f).

Alternatively the transfer pad may be used for the preparation of flexible organic electronic devices on the piece of polymer.

The resist pattern can be prepared on single crystalline or polycrystalline materials, single crystalline or polycrystalline composite materials such as GaAs, Si, $SiO_2$, Mica, amorphous composites, such as glass and float glass, and perovskites for example. For the specific embodiments, $SiO_2$, Mica, and float glass were used.

The resist pattern can be prepared by optical-, e-beam lithography, soft lithography, UV-nanoimprint lithography or nanoimprint lithography. For the specific embodiments the resist patterns were prepared by optical and e-beam lithography.

After the resist process, the surfaces may be passivated with a release layer. For the specific embodiments either no lubricant layer was used, or 1,1,2,2,-tridecafluoro-octyl)-trichlorosilane was used.

The transfer pads for the process can generally be made from elastomers, plastomers, ionomers, and resists. The pads are prepared either by drop casting and thermal- or photo-induced curing or by hot embossing techniques. The pads should be fairly smooth and flat. For the specific embodiments, POP (Affinity VP 8770G) from Dow Chemicals and PDMS (Sylgard 184, Dow Corning) was used. The transfer pads may be attached to a hard backplane. The transfer pads maybe chemically modified with a transfer mediating layer.

In the following, reference is made to the figures wherein

Figure 3A:
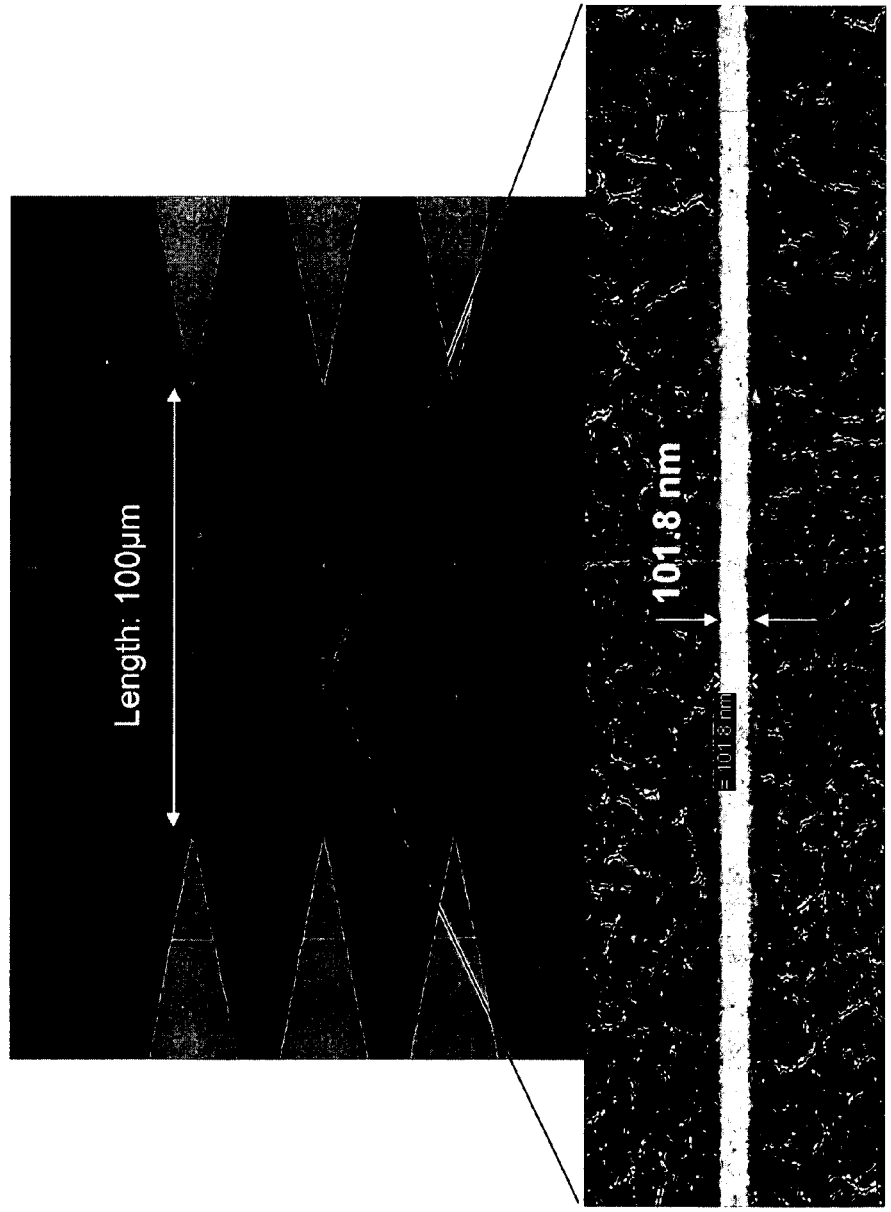
Figure 5:
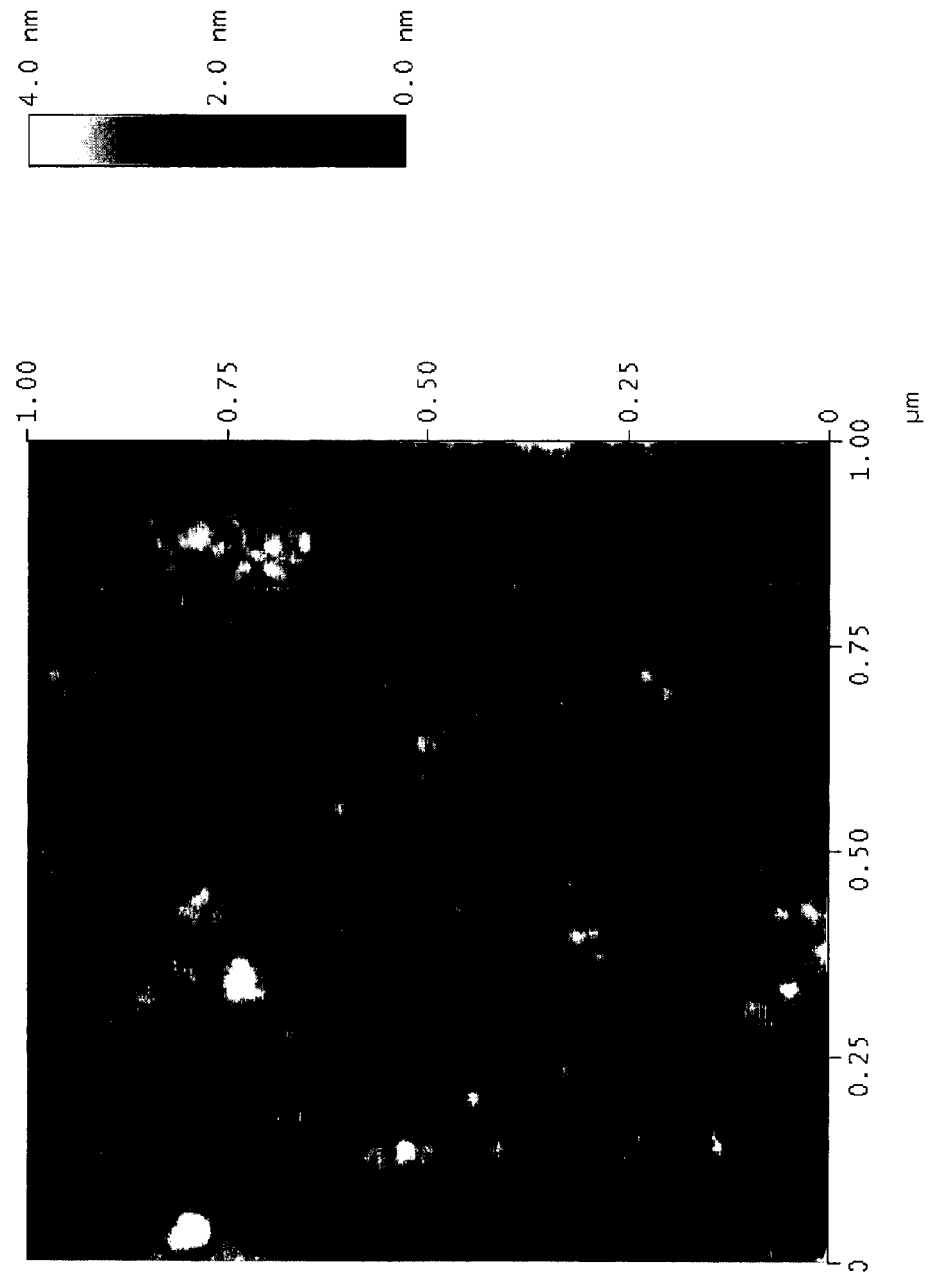
Figure 6:
Figure 7:
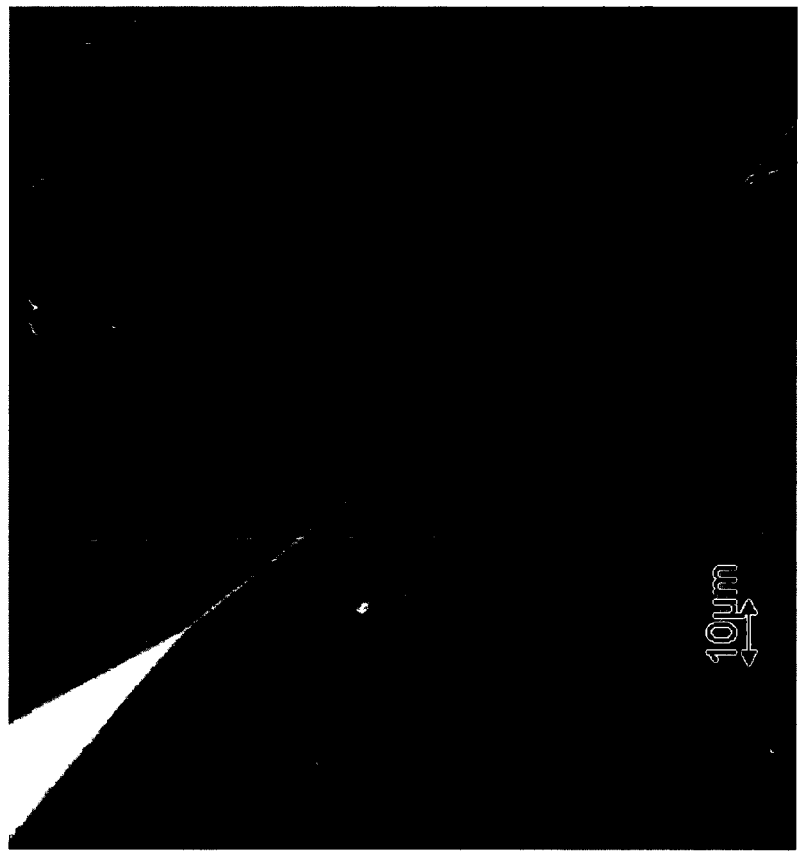
Figure 8:
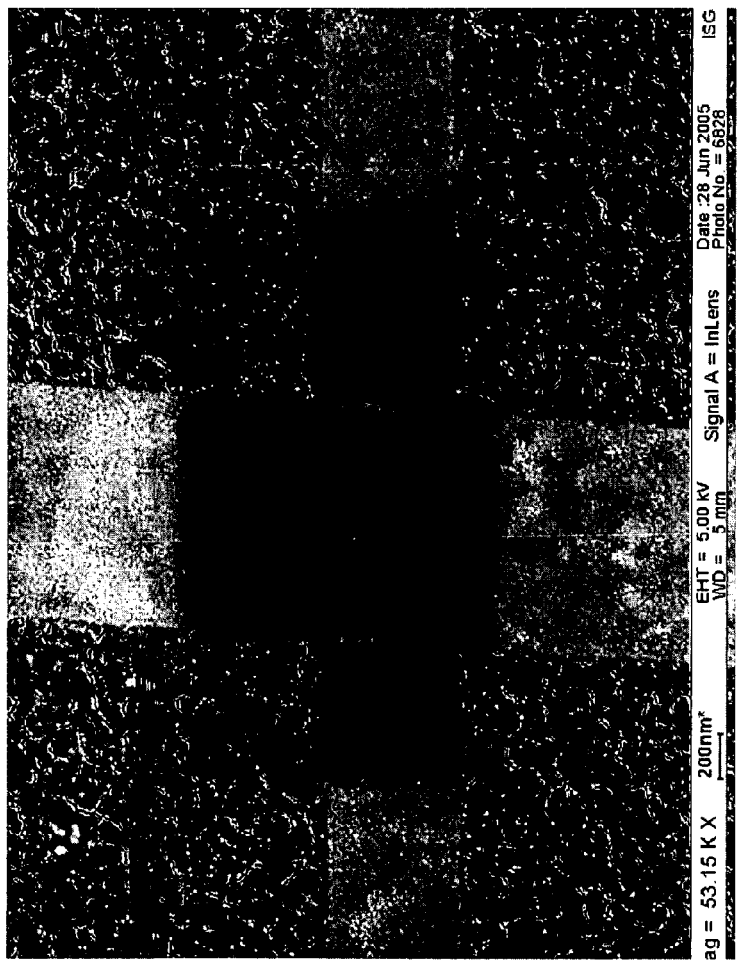
Figure 10:
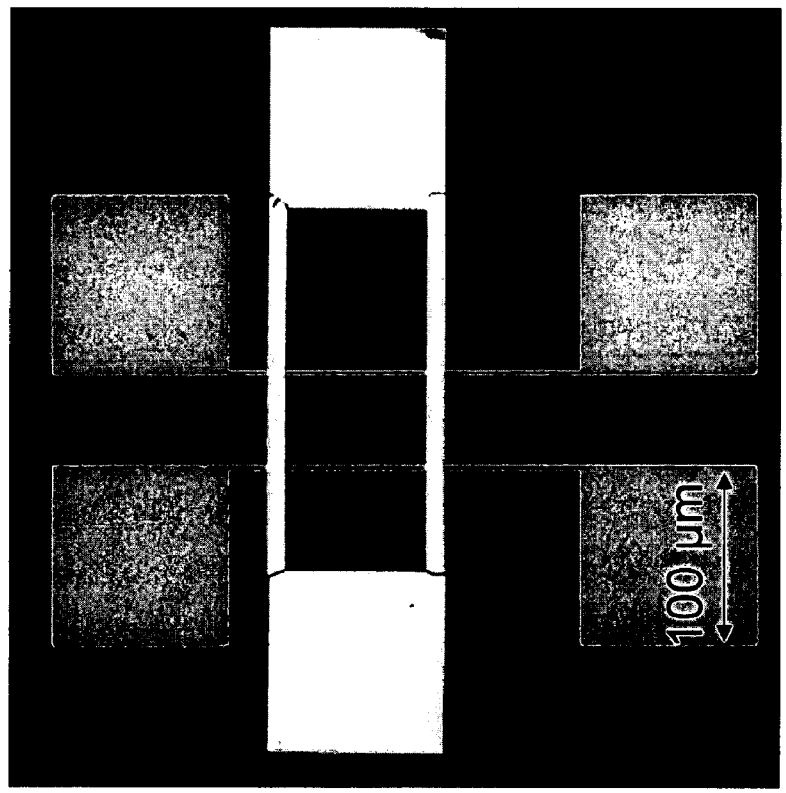

FIG. 1 shows a schematic representation of the nanotransfer printing process (nTP) (a) and the soft-contact lamination process (ScL) (b), FIGS. 2a)-f) show schematic representations of six different embodiments of the process according to the present invention, FIGS. 3a)-b) show the result obtained by process 1 in accordance with the present invention, wherein FIG. 3a shows a line of Au, approximately 100 nm wide, and FIG. 3b shows lines of Au which are 47.8 nm and 50 nm wide, respectively, FIG. 4a) shows a microscopic image of a 15 nm Au layer transferred from $SiO_2$ onto PDMS without a back plane using process 2, FIG. 4b) shows a microscopic image of a 15 nm Au layer transferred from $SiO_2$ onto PDMS with a back plane using process 2, FIG. 5 shows an atomic force microscope (AFM) image of a 20 nm Au layer transferred from Mica onto POP without a back plane using process 3 with a mean surface roughness of 0.5 nm, FIG. 6 shows a microscopic image of a 15 nm Au layer transferred from $SiO_2$ onto POP without a backplane using process 4, FIG. 7 shows an optical image of an Au pattern on a PAMMA-G6 modified $SiO_2$ surface using POP as a shuttle substrate ("second substrate"), FIG. 8 shows a scanning electron microscope (SEM) image of a cross bar structure applied by the method according to the present invention onto POP, FIG. 9 shows a scanning electron microscope image of a cross bar structure prepared by the method according to the present invention using POP as a shuttle substrate onto a PAMMAM-G6-modified $SiO_2$ surface, and FIG. 10 shows an optical microscope image of a crossbar structure (Au on Au) on Si/SiO2.

Figure 11:
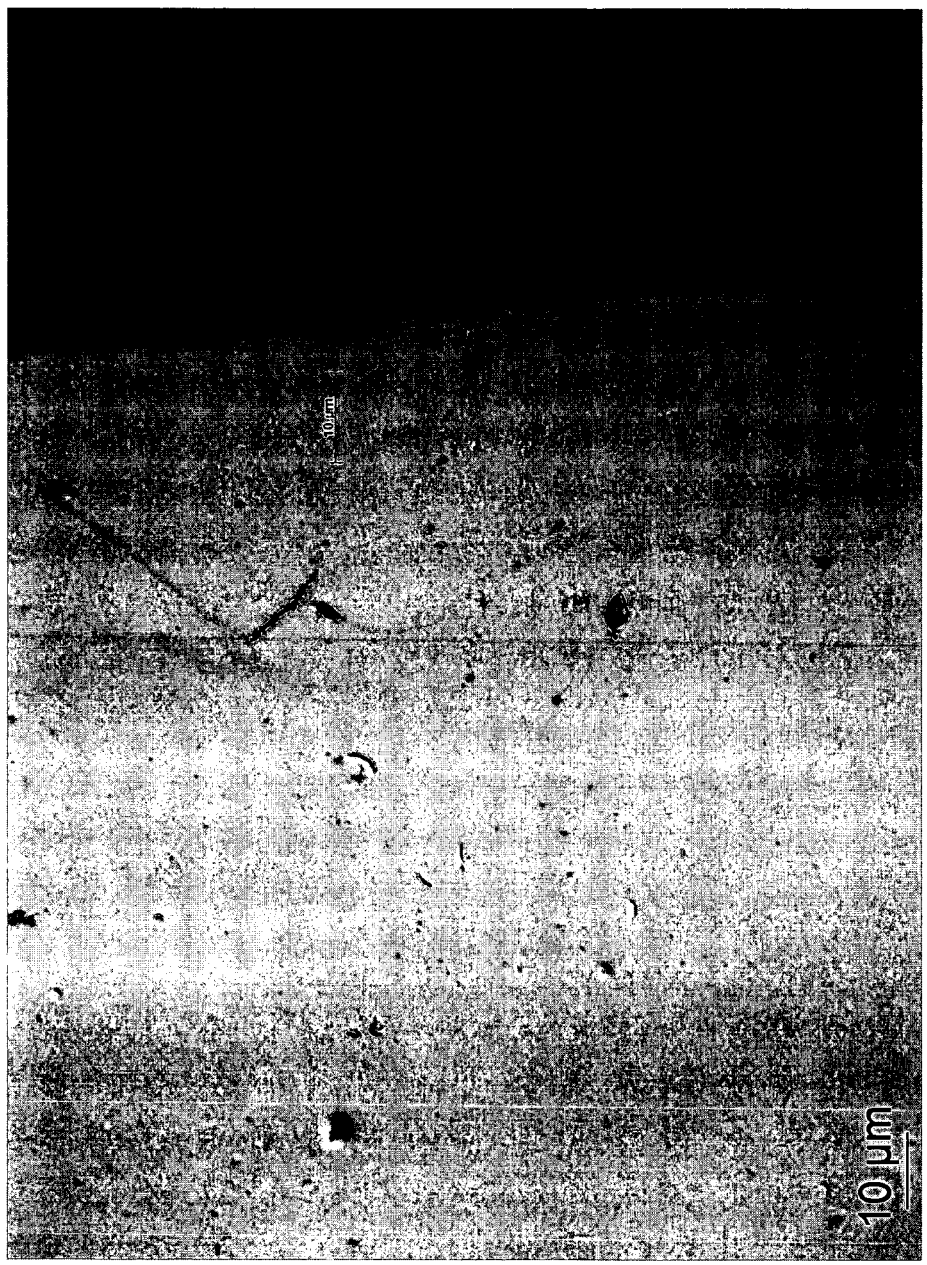
Figure 12:
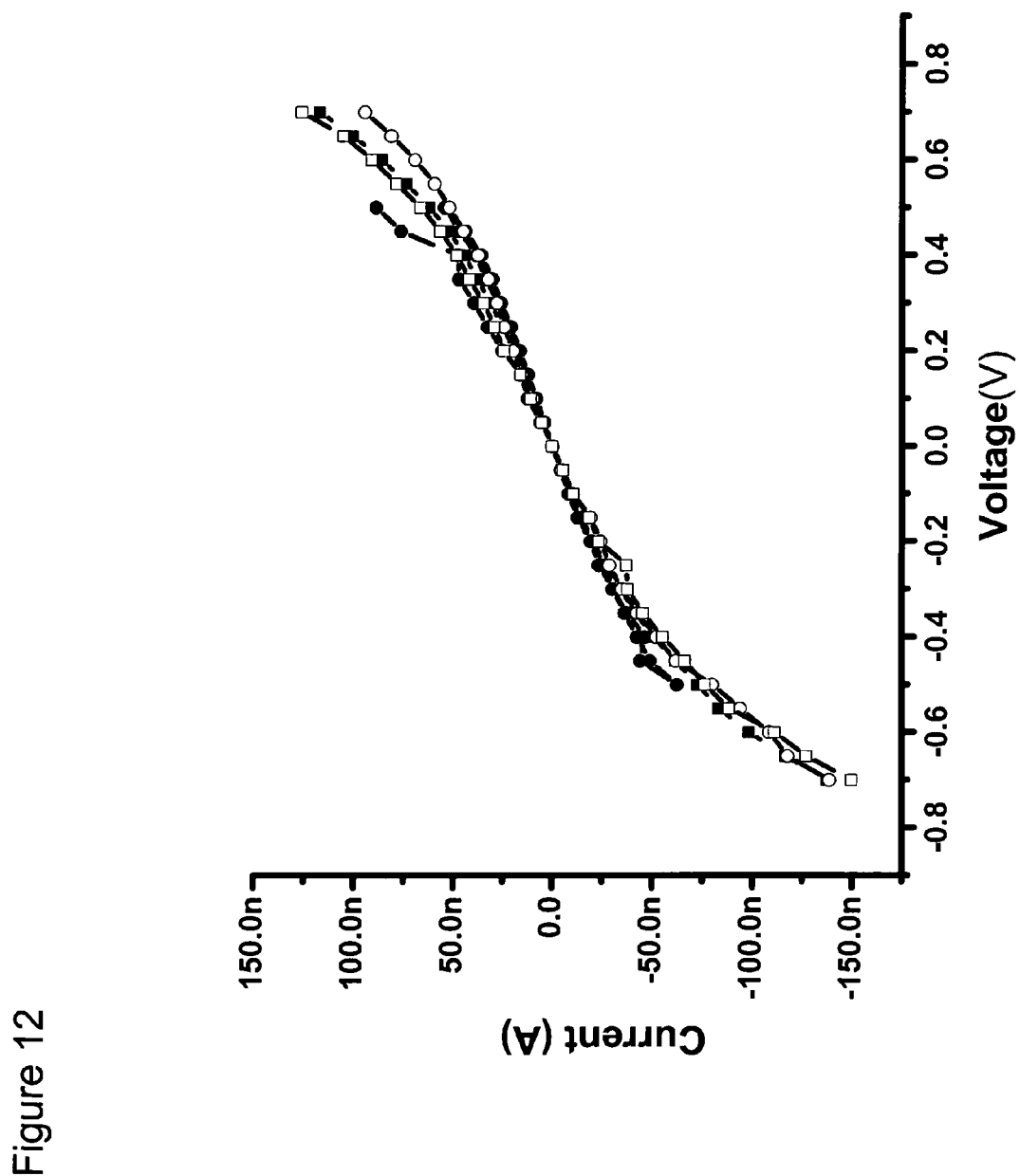

FIG. 11 shows an optical microscope image of Au transferred from a glass substrate via a POP shuttle substrate to a $Si/SiO_2$ target substrate, FIG. 12 shows several traces of an I-V curve of a crossbar structure in accordance with the present invention. The I-V curve was measured several times using the same crossbar structure. Different measurements are shown as different traces. The bottom Au electrodes were fabricated on substrate 2 according to process 2, a monolayer of 1,4, benzenedithiol was assembled onto the Au electrodes, and subsequently the top electrodes were also fabricated according to process 2. The current is indicated in nano Ampere (nA). The current measured in this device is 5 orders of magnitudes smaller than the current measured in devices fabricated according to the state of the art. However, the high current measured in the state of the art devices is indicative of filament formation due to defects and is a result of the filament formation in the devices.

In contrast thereto, the small size of the current measured with a crossbar structure according to the present invention indicates that the current is via the molecular layer thus created, and no filaments are involved which would give rise to significantly higher currents.

Moreover reference is made to the following examples which are given to illustrate, not to limit the present invention.

EXAMPLES

All specific embodiments were performed with Au as metal.

The transferred patterns were investigated with optical microscopy, scanning electron microscopy, and atomic force microscopy. Transferred Au layers were electrically characterized using a probe setup and an analyzer.

Example 1

A PMMA resist was spin-coated onto wafer with native oxide and patterned using electronbeam lithography. After development a descum plasma treatment was used to clean the trenches. A perfluoro-alkyltrichlorsilane was vapor deposited onto that wafer. 20 nm of Au was evaporated at a rate of 8 Å/s onto the wafer at a pressure of $2 \cdot 10^{-7}$ mbar. A lift-off was performed using Acetone and Isopropanol. The patterned Au was transferred onto a freshly prepared POP pad without backplane (FIG. 3a and b). The background in FIG. 3b is due to a thin sputtered layer of Au that is required in order to prevent charging effects during SEM imaging. The lines of Au thus created have dimensions of ~50 nm, and the size could be easily reduced to 5-10 nm.

Example 2

20 nm of Au was evaporated at a rate of 3 Å/s onto a Si wafer with a native oxide layer at a pressure of $2 \cdot 10^{-6}$ mbar. The Au was transferred onto a freshly prepared PDMS pad without backplane by quickly detaching the PDMS pad from the $SiO_2$ wafer. The Au layer (FIG. 4a) shows folding, which result from the flexibility of the PDMS.

Example 3a 15 nm of Au was evaporated at a rate of 3 Å/s onto a Si wafer with a native oxide layer at a pressure of $2 \cdot 10^{-6}$ mbar. The Au was transferred onto a freshly prepared PDMS pad attached to a glass backplane after immersion into isopropanol from the $SiO_2$ wafer onto the PDMS pad. The Au layer (FIG. 4b) shows some cracks, which result from the flexibility of the PDMS.

Example 3b 20 nm of Au was evaporated at a rate of 3 Å/s onto Mica substrate at a pressure of $2 \cdot 10^{-6}$ mbar. The Au was transferred onto a freshly prepared POP pad with backplane after immersion into water. Water is dragged between the Mica sheet and the Au layer by capillary forces and forced the detachment of Au from Mica. The Mica sheet detaches from the Au layer once the water is dragged fully into the interface between Au and Mica (FIG. 5).

Example 4

15 nm of Au was evaporated at a rate of 3 Å/s onto a glass substrate at a pressure of $2 \cdot 10^{-6}$ mbar. The Au was transferred onto a freshly prepared POP pad without backplane after immersion it for 2.5 h into a 0.01 M solution of a decyldithiocarbamte sodium salt and rinsing it with MilliQ water. Subsequently the Au layer is brought into contact with a thin sheet of POP for the transfer of the Au layer (FIG. 6).

Example 5

A silicon chip with a 1000 nm $SiO_2$-Layer was immersed into a 1 mM solution of a PAMAM-OS G6 dendrimer in methanol for 5 min and dried under a stream of Argon. The POP with the patterned gold (prepared according to Example 1) was pressed onto the PAMAM-OS G6 modified surface for 2 min. After removing the POP the gold was transferred to the PAMAM-OS surface. (FIG. 7)

Example 6

Onto the piece of POP with gold patterns of Example 1 a second pattern is transferred as described in Example 1 in a way that two electrodes cross each other in a 90 degree angle and form a crossbar (FIG. 8).

Example 7

A PMMA resist was spin-coated onto wafer with native oxide and patterned using electronbeam lithography. After development a descum plasma treatment was used to clean the trenches. 20 nm of Au was evaporated at a rate of 8 Å/s onto the wafer at a pressure of $2 \cdot 10^{-7}$ mbar. A lift-off was performed using Acetone and Isopropanol. The chip was immersed into the PAMAM-OS G6 solution in Methanol for 5 min and dry-blown in Argon. The piece of POP with gold patterns of Example 1 was placed onto this chip in a way, that the two electrodes cross each other in a 90 degree angle and form a crossbar. The POP was removed and the second electrodes stayed on the chip (FIG. 9).

Example 8

40 nm of Au was evaporated at a rate of 3 Å/s onto a the patterned Si/SiO2 substrate at a pressure of $2 \cdot 10^{-6}$ mbar. For the transfer of the Au pattern onto polyolefine, the polymer was heated to 90° C. and pressed for ~30 min between two Si/SiO$_2$ wafers. After cooling the POP down to room temperature, the POP is brought into conformal contact with the Au pattern for the transfer of Au onto POP 30 µl of Hexane is placed on the POP pad. After 120 sec the Hexane is evaporated and the POP pad with the Au pattern is brought into conformal contact with the target Si/SiO$_2$ substrate (FIG. 10). FIG. 10 also shows Au electrodes obtained by conventional optical lithography for comparison.

Example 9

20 nm of Au was evaporated at a rate of 3 Å/s onto a glass substrate at a pressure of $2 \cdot 10^{-6}$ mbar. The Au was immersed into a 1 mM mercapto-undecanoicacid in ethanol solution for 5 min, was rinsed with pure ethanol afterwards and blow dried with nitrogen. The gold was transferred onto a freshly prepared POP pad without backplane. A piece of silicon with native oxide was cleaned in sulphuric acid, rinsed in Milli Q water, and flame annealed. A drop of isopropanol was put onto this piece. Subsequently the Au layer on the POP is brought into contact with that piece with the isopropanol. After 1 min the POP is lifted and the gold stays on the silicon piece. (FIG. 11)

1. Xia, Y; Whitesides, G. M.; Annu. Rev. Mater. Sci. 28 (1998), 153-184.
2. Michel, B. et al.; IBM J. Res. & Dev. 45 (2001), 697-719.
3. Hsu, J. W. P.; Materials Today July/August (2005), 42-54.
4. Loo, Y.-L., Willett, R. L. Baldwin, K. W., J. A. Rogers, Appl. Phys. Lett. (2002), 81, 562-564.
5. Loo et al., U.S. Pat. No. 6,946,332 B2.
6. Loo, Y.-L., et al. Proc. Natl. Acad. Sci. USA (2002), 99, 10252.
7. Loo, Y.-L., et al. J. Vac. Sci. Technol. B (2002), 20, 2853.
8. Loo, Y.-L., Willett, R. L. Baldwin, K. W., J. A. Rogers, JACS (2002), 124, 7654-7655.
9. Hines, D. R., et. al *Applied Physics Letters* (2005), 86, 63101.
10. Bernards, D. A. Biegala, Z. A. S. Slinker, J. D., Malliaras, G. G., Flores-Torres, S., Abruña, H. D., Rogers, J. A., Appl. Phys. Lett. (2004), 84, 3675.
11. Hsu, J. W. P, et.al; J. Vac. Sci. Technol. B (2003), 21, 1928-1935.

The features of the present invention disclosed in the specification, the claims and/or in the accompanying drawings, may, both separately, and in any combination thereof, be material for realising the invention in various forms thereof.

The invention claimed is:

1. A method of applying a pattern of metal, metal oxide and/or semiconductor material on a substrate, comprising:
   a) providing a first substrate,
   b) creating a pattern of metal, metal oxide and/or semiconductor material on said first substrate,
   c) providing a second substrate and bringing it into conformal contact with said pattern of metal, metal oxide and/or semiconductor material on said first substrate,
   d) separating said second substrate from said first substrate, thus having said pattern of metal, metal oxide and/or semiconductor material adhere to said second substrate and being separated together with said second substrate from said first substrate,
   after said pattern of metal, metal oxide and/or semiconductor material has been created in b) on said first substrate, a transfermediating layer is applied to said pattern of metal, metal oxide and/or semiconductor material prior to c), which transfermediating layer serves the purpose of mediating adhesion between said pattern of metal, metal oxide and/or semiconductor material and said second substrate, and
   said transfermediating layer is made of a material comprising a compound having at least two termini, wherein one terminus is a metal binding, metal oxide binding or semiconductor binding group, such as thiol, and the other terminus provides controllable adhesion to said second substrate.

2. The method according to claim 1, wherein b) is performed by the following sequence:
   ba) creating a resist pattern on said first substrate,
   bb) applying a layer of metal, metal oxide and/or semiconductor material on said first substrate having said resist pattern on it,
   bc) removing said resist pattern from said first substrate to leave behind a pattern of metal, metal oxide and/or semiconductor material on said first substrate.

3. The method according to claim 1, wherein b) is performed by the following sequence:
   ba) applying a layer of metal, metal oxide and/or semiconductor material on said first substrate,
   bb) creating a resist pattern on said first substrate having said layer of metal on it,
   bc) removing said layer of metal, metal oxide and/or semiconductor material in positions which are not covered by said resist pattern, by means of an etching technique,
   bd) removing said resist pattern from said first substrate to leave behind a pattern of metal, metal oxide and/or semiconductor material on said first substrate.

4. The method according to claim 1, wherein b) is performed by:
   ba) applying a layer of metal, metal oxide and/or semiconductor material on said first substrate by using a patterned mask through which said metal, metal oxide and/or semiconductor material is applied such that said layer of metal, metal oxide and semiconductor material becomes patterned.

5. The method according to claim 1, wherein said resist pattern on said first substrate comprises positions having resist present on said first substrate and positions having no resist present on said first substrate.

6. The method according to claim 2, wherein in bb), said layer of metal, metal oxide and/or semiconductor material is applied on said first substrate on said resist pattern both in said positions having resist present and in said positions having no resist present.

7. The method according to claim 2, wherein said layer of metal, metal oxide and/or semiconductor material is applied as a continuous layer.

8. The method according to claim 2, wherein said pattern of metal, metal oxide and/or semiconductor material created by b), comprises positions having metal, metal oxide and/or semiconductor material present on said first substrate and positions having no metal, metal oxide and/or semiconductor material present on said first substrate, and said positions of said pattern of metal, metal oxide and/or semiconductor material having metal, metal oxide and/or semiconductor material present on said first substrate coincide with positions of said resist pattern of ba) where there is no resist present on said first substrate in ba).

9. The method according to claim 3, wherein said pattern of metal, metal oxide and/or semiconductor material created by b), comprises positions having metal, metal oxide and/or semiconductor material present on said first substrate and positions having no metal, metal oxide and/or semiconductor material present on said first substrate, and said positions of said pattern of metal, metal oxide and/or semiconductor material having metal, metal oxide and/or semiconductor material present on said first substrate coincide with positions of said resist pattern of bb) where there is resist present on said first substrate in bb).

10. The method according to claim 2, wherein said resist pattern is created by a lithographic process, preferably by a lithographic process selected from the group comprising optical lithography, electron beam lithography, soft lithography, UV-nanoimprint lithography and nanoimprint lithography.

11. The method according to claim 2, wherein said layer of metal, metal oxide and/or semiconductor material is applied on said first substrate by a process selected form the group comprising vapour deposition, sputtering, evaporation, wet chemical deposition, plating and selfassembly.

12. The method according to claim 2, wherein the removing of said resist pattern occurs by dissolving said resist pattern in a solvent, such acetone, isopropanol, N-pyrrolidone, and special resist removers, such as AZ-remover, and any combination thereof.

13. The method according to claim 1, wherein said first substrate is made of a material selected from the group comprising single crystalline materials, polycrystalline materials, materials such as GaAs, Si, $SiO_2$, mica, amorphous composites, such as glass and float glass, and perovskites.

14. The method according to claim 1, wherein said metal is select from the group comprising Au, Ti, Pt, Ag, Cr, Cu, Al, said metal oxide is selected from the group comprising $Al_2O_3$, AgO, $TiO_2$, $SiO_2$, $DyScO_3$, yttria stabilized zirconia (YSZ), and said semiconductor material is selected from the group comprising Si, Ge, GaAs, GaN, InSb, InP, CdS, ZnSe.

15. The method according to claim 2, wherein said layer of metal, metal oxide and/or semiconductor material is applied directly on said first substrate or, if present, on said resist pattern on said first substrate, without a layer of lubricant being present on or having been previously applied to said first substrate or, if present, on said resist pattern on said first substrate, said layer of metal, metal oxide and/or semiconductor material after application thus being in direct contact with said first substrate and/or said resist pattern.

16. The method according to claim 2, wherein ba) is performed in the following manner:
ba) creating a resist pattern on said first substrate and thereafter applying a layer of lubricant to said resist pattern on said first substrate to weaken the adhesion between said pattern of metal, metal oxide and/or semiconductor material and said first substrate having a resist pattern on it.

17. The method according to claim 3, wherein ba) is performed in the following manner:
ba) applying a layer of lubricant to said first substrate and thereafter applying a layer of metal, metal oxide and/or semiconductor material to said first substrate having a layer of lubricant on it, said layer of lubricant serving the purpose of weakening the adhesion between said pattern of metal, metal oxide and/or semiconductor material and said first substrate.

18. The method according to claim 4, wherein ba) is performed in the following manner:
ba) applying a layer of lubricant to said first substrate and thereafter applying a layer of metal, metal oxide and/or semiconductor material to said first substrate having a layer of lubricant on it, said layer of lubricant serving the purpose of weakening the adhesion between said pattern of metal, metal oxide and/or semiconductor material and said first substrate.

19. The method according to claim 16, wherein said lubricant is selected from the group comprising fluorosilanes, such as perfluoro-alkyltrichlorosilane $C_4F_8$, silane derivatives with a $CH_3$ terminus, teflon and teflon-like materials.

20. The method according to claim 16, wherein in ba) said layer of lubricant is applied to said resist pattern on said first substrate, wherein, after subsequently removing said resist pattern in bc), said layer of lubricant is only present in said positions having no resist present.

21. The method according to claim 20, wherein in bb), said layer of metal, metal oxide and/or semiconductor material is applied on said first substrate having a resist pattern on it, such that it is in direct contact with said resist pattern in positions having resist present and in direct contact with said lubricant in positions having no resist present.

22. The method according to claim 1, wherein said transfermediating layer is providing controllable adhesion by comprising at least one compound having polar groups for interaction with a hydrophilic solvent, said compound preferably forming a self-assembled monolayer, such as an alkanethiol, or said transfer mediating layer is soluble in water, such as a layer of CaO.

23. The method according to claim 1, wherein said second substrate is made of a polymeric material, preferably a polymeric material selected from the group comprising elastomers, plastomers, ionomers and resists.

24. The method according to claim 1, wherein during or after c) and before d), said second substrate and said pattern of metal, metal oxide and/or semiconductor material on said first substrate, whilst being in conformal contact with each other, are exposed or placed into a polar solvent to weaken the adhesion between said pattern of metal, metal oxide and/or semiconductor material and said first substrate.

25. The method according to claim 24, wherein said polar solvent is selected from the group of organic and inorganic polar solvents and mixtures thereof, preferably from the group comprising water, isopropanol, ethanol, methanol, acetone, dimethylsulfoxide and acetonitrile, and mixtures thereof.

26. The method according to claim 24, wherein said solvent does not have any added solutes dissolved in said solvent.

27. The method according to claim 1, wherein after b) and before c), said pattern of metal, metal oxide and/or semiconductor material on said first substrate is placed in a solution of a surfactant and, optionally, subsequently rinsed.

28. The method according to claim 27, wherein said surfactant is selected from the group comprising dithiocarbamate derivatives formed from alkane chains with primary amines, and the solvent wherein said surfactant is dissolved is selected from the group comprising isopropanol, ethanol, water and mixtures thereof.

29. The method according to claim 1, further comprising:
e1) providing a third substrate, bringing it into conformal contact with said second substrate having said pattern of metal, metal oxide and/or semiconductor material on it, and separating said second substrate from said third substrate, thus having said pattern of metal, metal oxide and/or semiconductor material adhere to said third substrate and being separated together with said third substrate from said second substrate.

30. The method according to claim 29, wherein said third substrate has functional groups allowing a transfer of said pattern of metal, metal oxide and/or semiconductor material from said second substrate to said third substrate, such as mercapto groups or amino groups on it.

31. The method according to claim 29, wherein said third substrate, prior to e1) has a further pattern of metal, metal oxide and/or semiconductor material on its surface, and/or an additional layer on it providing functionality, and/or is covered with nanowires, nanocolumns, carbon nanotubes, and/or has switchable oxides, such as $TiO_2$ or perovskites on it.

32. The method according to claim 1, further comprising:
e2) using said second substrate having said pattern of metal, metal oxide and/or semiconductor materials adhered to it for the preparation of a flexible organic electronic device, such as an organic light emitting diode (OLED), an organic field effect transistor (OFET), a molecular electronic device or a sensor device, preferably by laminating said second substrate to another substrate and thereby sandwiching said pattern of metal, metal oxide and/or semiconductor material between the two substrates.

33. The method according to claim 1, wherein said pattern of metal, metal oxide and/or semiconductor material has an adhesion force to said first, second and, if present, third substrate, wherein the adhesion force to said third substrate is greater than the adhesion force to said second substrate which is greater than the adhesion force to said first substrate.

34. The method according to claim 33, wherein said pattern of metal, metal oxide and/or semiconductor material is a pattern of gold, said first substrate is Si, with or without an oxide layer on it, or mica, or glass, said second substrate is a polyolefine plastomer (POP) or polydimethylsiloxane (PDMS), or a ionomer such as Surlyn, and said third substrate, if present, is Si, mica, or glass, which is optionally functionalized with functional groups, to allow adhesion of said pattern of gold on it.

35. The method according to claim 34, wherein said functionalizing occurs by using compounds having mercapto groups or amino groups or carboxy groups, preferably dendrimer compounds.

36. The method according to claim 1, wherein e1) is performed in the absence of any additional layer providing functionality on said third substrate.

37. The method according to claim 36, wherein e1) is performed by weakening the adhesion forces between said second substrate and said pattern of metal, metal oxide and/or semiconductor material by exposing said second substrate and said pattern of metal, metal oxide and/or semiconductor material on it to a solvent or placing it into a solvent such as isopropanol, ethanol, methanol, propanol and hexane.

38. The method according to claim 29, wherein e1) is performed by weakening the adhesion forces between said second substrate and said pattern of metal, metal oxide and/or semiconductor material by placing a solvent between said second substrate having said pattern of metal, metal oxide and/or semiconductor material on it and said third substrate, and thereby increasing the adhesion forces between said third substrate and said pattern of metal, metal oxide and/or semiconductor material or, if present, between said transfer mediating layer on said third substrate and said pattern of metal, metal oxide and/or semiconductor material.

39. The method according to claim 1, wherein second substrate is prepared by a method selected from the group comprising drop casting, curing, preferably thermo or photo induced curing, and hot embossing.

40. The method according to claim 1, wherein said second substrate has a flat surface which, in c), said pattern of metal, metal oxide, and/or semiconductor material is brought into conformal contact with said second substrate.

41. The method according to claim 40, wherein said second substrate has a stabilizing hard back plane opposite said flat surface.

42. The method according to claim 1, wherein said bringing into conformal contact in c) and e1) occurs for a period in the range of from 1 s-120 min.

43. The method according to claim 1, wherein said bringing into conformal contact in c) and e1) is a pressing process with an average pressure of 1 mbar-5 bar.

44. A pattern of metal, metal oxide and/or semiconductor material on a substrate produced by the method according to claim 1.

45. The pattern according to claim 44, having no defects or artifacts in said pattern.

46. Use of the pattern according to claim 44 in an electronic device, polymeric device, biomedical device.

* * * * *